(12) United States Patent
 Kawanago et al.

(10) Patent No.: US 10,529,925 B2
(45) Date of Patent: Jan. 7, 2020

(54) DISPLAY DEVICE

(71) Applicant: Japan Display Inc., Tokyo (JP)

(72) Inventors: Hiroshi Kawanago, Tokyo (JP); Kazufumi Watabe, Tokyo (JP)

(73) Assignee: Japan Display Inc., Tokyo (JP)

( * ) Notice: Subject to any disclaimer, the term of this patent is extended or adjusted under 35 U.S.C. 154(b) by 50 days.

(21) Appl. No.: 15/831,452

(22) Filed: Dec. 5, 2017

(65) Prior Publication Data

US 2018/0102478 A1 Apr. 12, 2018

Related U.S. Application Data

(63) Continuation of application No. 15/246,707, filed on Aug. 25, 2016, now Pat. No. 9,865,817.

(30) Foreign Application Priority Data

Sep. 16, 2015 (JP) ................................. 2015-182983

(51) Int. Cl.
| | | |
|---|---|---|
| H01L 27/32 | (2006.01) | |
| H01L 51/00 | (2006.01) | |
| H05B 33/10 | (2006.01) | |
| H05B 33/12 | (2006.01) | |
| H05B 33/08 | (2006.01) | |
| H01L 51/52 | (2006.01) | |

(52) U.S. Cl.
CPC ........ *H01L 51/003* (2013.01); *H01L 27/3244* (2013.01); *H05B 33/0896* (2013.01); *H05B 33/10* (2013.01); *H05B 33/12* (2013.01); *H01L 27/322* (2013.01); *H01L 51/5284* (2013.01); *H01L 2227/323* (2013.01); *H01L 2227/326* (2013.01); *H01L 2251/5338* (2013.01)

(58) Field of Classification Search
CPC ... H01L 27/3244; H01L 27/322; H01L 33/10; H01L 33/12; H01L 33/0896
See application file for complete search history.

(56) References Cited

U.S. PATENT DOCUMENTS

| | | |
|---|---|---|
| 2010/0012955 A1 | 1/2010 | Sorg et al. |
| 2015/0166860 A1 | 6/2015 | Yuan et al. |

FOREIGN PATENT DOCUMENTS

JP    2013-145808 A    7/2013

*Primary Examiner* — Douglas M Menz
(74) *Attorney, Agent, or Firm* — Michael Best & Friedrich LLP

(57) ABSTRACT

A method of manufacturing a display device, including: a stacking step of stacking, on a glass substrate, a sacrificial resin layer, a metal layer, a transparent metal oxide layer, a base material resin layer, and a functional layer including at least one of a pixel circuit-constituting layer driving a plurality of pixels and a color filter layer, in this order; a radiating step of radiating a pulsed light of a xenon flash lamp to the metal layer through the glass substrate and the sacrificial resin layer; and a detaching step of reducing a force of adhesion between the sacrificial resin layer and the metal layer with the pulsed light radiated in the radiating step, and detaching the sacrificial resin layer from the metal layer.

17 Claims, 8 Drawing Sheets

DISPLAY DEVICE

CROSS-REFERENCE TO RELATED APPLICATIONS

This application is a continuation of U.S. patent application Ser. No. 15/246,707 filed on Aug. 25, 2016. Further, this application claims priority from Japanese application JP2015-182983 filed on Sep. 16, 2015, the contents of which are hereby incorporated by reference into this application.

BACKGROUND OF THE INVENTION

1. Field of the Invention

The present invention relates to a method of manufacturing a display device, and a display device.

2. Description of the Related Art

Flexible displays allowing a display screen to be flexibly deformed are known.

In manufacturing the flexible display, a resin material such as polyimide is first deposited on a support substrate of glass or the like, and a functional layer in which thin film transistors or color filters are arranged is formed on the resin material. Thereafter, a step of detaching the resin material from the substrate is provided.

In JP 2013-145808 A, it is described to provide a method of detaching a substrate, which is low in cost and has high productivity.

Here, as a technique for detaching the resin material from the support substrate, radiating a laser to the rear surface of the resin material to ablate the resin material is known. However, using the laser increases a device cost and decreases throughput, making it difficult to realize efficient mass production.

It is also conceivable that a metal layer as a heat exchange membrane is formed between the glass substrate and the resin layer, light of a flash lamp is radiated from the glass substrate side to thermally decompose instantaneously the resin located at the interface of the metal layer, and the resin layer is detached from the glass substrate.

In the method using the flash lamp, however, while heat is easily generated at the interface between the glass substrate and the metal layer, the heat generated is less likely to be conducted to the resin layer and thus the resin located at the interface of the metal layer may not be thermally decomposed sufficiently. Moreover, it is also conceivable to facilitate the heat conduction to the resin layer by thinning the metal layer. However, the thinned metal layer allows the light emitted by the flash lamp to reach the functional layer located on the resin layer, so that the functional layer may be destroyed.

SUMMARY OF THE INVENTION

In view of the problems described above, it is an object of the invention to provide a method of efficiently detaching a resin layer, on which a functional layer such as a color filter layer or a thin film transistor layer is formed, from a support substrate in manufacturing a display device and a flexible display. Moreover, it is an object of the invention to provide a display device in which a detaching method in manufacturing a display device and a flexible display is made efficient.

In view of the problems described above, a method of manufacturing a display device according to an aspect of the invention includes: a stacking step of stacking, on a glass substrate, a sacrificial resin layer, a metal layer, a transparent metal oxide layer, a base material resin layer, and a functional layer including at least one of a pixel circuit-constituting layer driving a plurality of pixels and a color filter layer, in this order; a radiating step of radiating a pulsed light of a xenon flash lamp to the metal layer through the glass substrate and the sacrificial resin layer; and a detaching step of reducing a force of adhesion between the sacrificial resin layer and the metal layer with the pulsed light radiated in the radiating step, and detaching the sacrificial resin layer from the metal layer.

In view of the problems described above, a display device according to another aspect of the invention includes: a first protective film; a metal layer stacked on the first protective film; a first transparent metal oxide layer stacked on the metal layer; a first base material resin layer stacked on the first transparent metal oxide layer; and a pixel circuit-constituting layer including a plurality of pixel circuits stacked on the first base material resin layer and controlling luminances for displaying an image.

DETAILED DESCRIPTION OF THE INVENTION

Hereinafter, a display device according to each embodiment of the invention will be described with reference to the drawings.

[First Embodiment]

Figure 1:
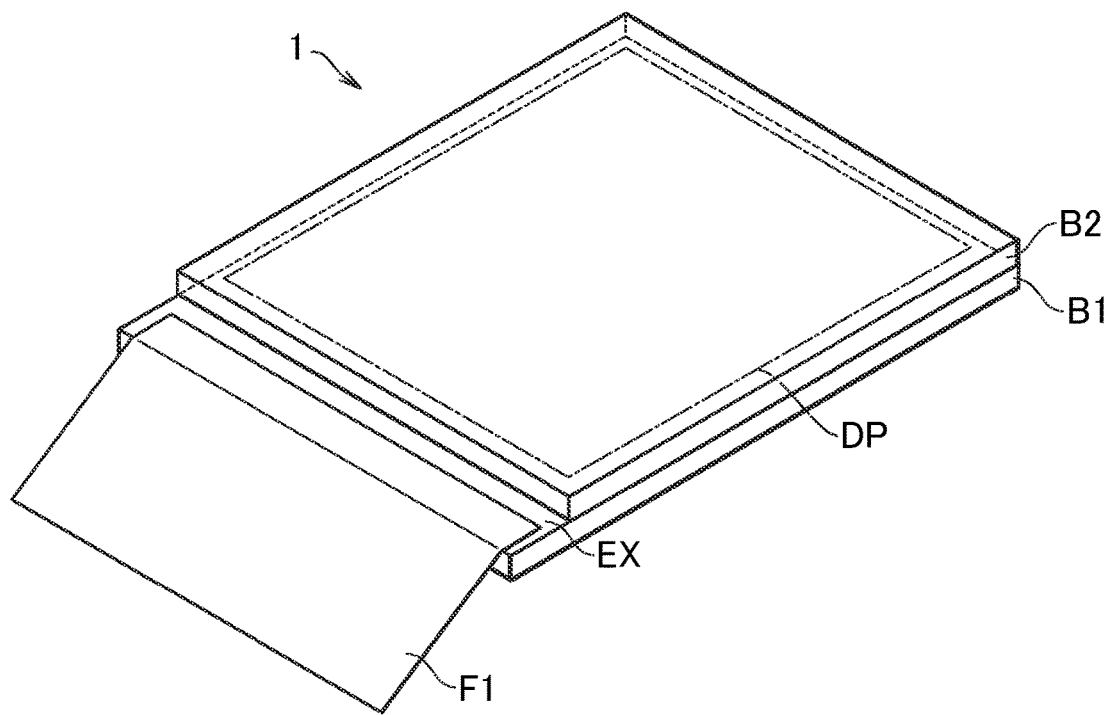
FIG. 1 is a perspective view of a display device according to a first embodiment.

FIG. 1 is a schematic perspective view for explaining a display device of a first embodiment using an organic EL display device as an example.

An organic EL display device 1 of the embodiment includes a first base material resin layer B1 on which a plurality of light-emitting elements (organic electroluminescence elements) are disposed, and a second base material resin layer B2 bonded to the first base material resin layer B1. The organic EL display device 1 includes a display area DP, and the plurality of light-emitting elements are located in the display area DP. A major surface of the first base material resin layer B1 facing the second base material resin layer B2 includes an area not covered by the second base material resin layer B2, that is, an exposed area (exposed area EX). A flexible printed board F1 is disposed in the exposed area EX.

Figure 2:
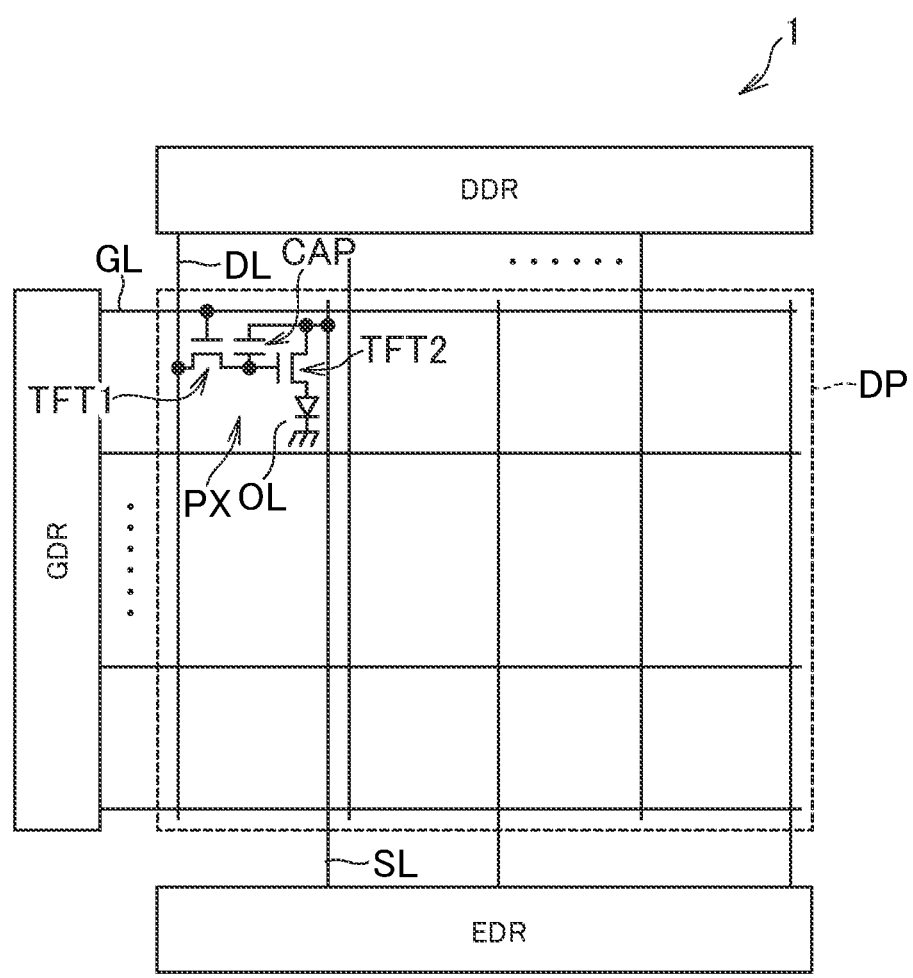
FIG. 2 is a schematic view showing a pixel circuit of the display device in the first embodiment.

FIG. 2 is a diagram showing a pixel circuit in the display area DP of the organic EL display device 1 of the first embodiment. The organic EL display device 1 includes the display area DP where an image is displayed, a scanning signal line drive unit GDR, a video signal line drive unit DDR, and a power source drive unit EDR.

In the display area DP, a plurality of pixel circuits PX that control luminances for displaying an image are disposed in a matrix. Moreover, an organic electroluminescence element OL (light-emitting element) is disposed corresponding to each of pixels. The pixel circuit PX includes a thin film transistor TFT1, a capacitive element CAP, and a thin film transistor TFT2. The scanning signal line drive unit GDR, the video signal line drive unit DDR, and the power source drive unit EDR drive the pixel circuits PX to control the emission of the organic electroluminescence elements OL.

The scanning signal line drive unit GDR is connected to scanning signal lines GL each provided for an array of pixels (pixel row) in the horizontal direction, and outputs a scanning signal to the scanning signal lines GL sequentially selected.

The video signal line drive unit DDR is connected to video signal lines DL each provided for an array of pixels (pixel column) in the vertical direction, and outputs, in synchronization with the selection of the scanning signal line GL by the scanning signal line drive portion GDR, a voltage in response to a video signal of the selected pixel row to each of the video signal lines DL. The voltage is written to the capacitive element CAP in the pixel circuit PX, and a current in response to the written voltage is supplied to the organic electroluminescence element OL.

The power source drive unit EDR is connected to drive power source lines SL each provided for the pixel column, and supplies a current to the organic electroluminescence element OL through the thin film transistor TFT2 in the pixel circuit PX.

A cathode of the organic electroluminescence element OL is connected to a ground potential, and the cathodes of the organic electroluminescence elements OL of all of the pixels are configured of a common electrode.

Figure 3A:
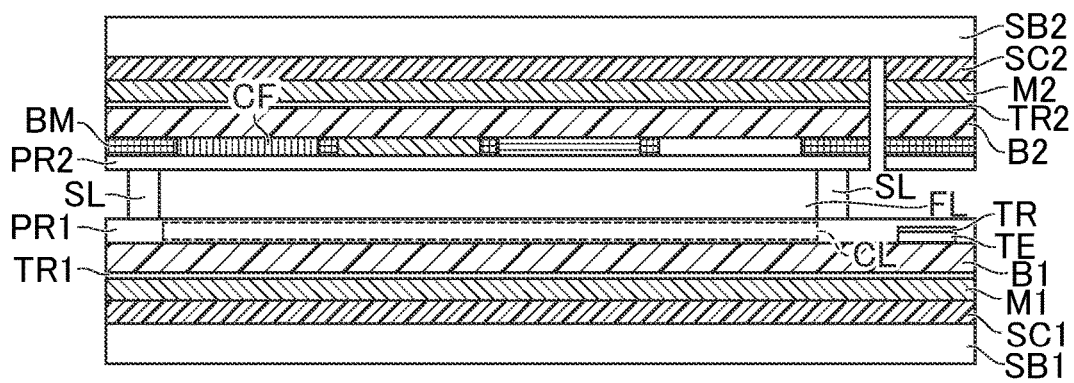
FIG. 3A is a diagram showing a cross-section of the display device in the first embodiment, in a state before detaching resin layers from support substrates.
Figure 3B:
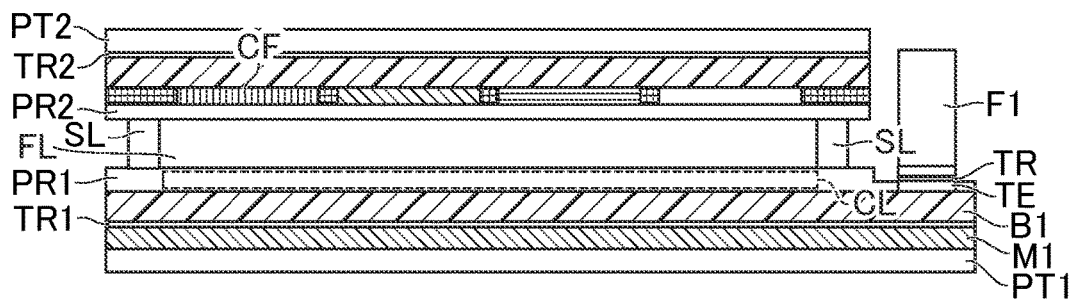
FIG. 3B is a diagram showing a cross-section of the display device in the first embodiment, in a state after detaching the resin layers from the support substrates.

FIG. 3A is a schematic view showing cross-sections of support substrates (glass substrates) SB1 and SB2 above which the base material resin layers B1 and B2 are respectively disposed, that is, cross-sections in a state before detaching the base material resin layers B1 and B2. FIG. 3B is a cross-sectional schematic view showing a state after detaching the base material resin layers B1 and B2 from the support substrates SB1 and SB2, that is, the state of a flexible display (the organic EL display device 1).

In the flexible display, since the base material resin layer B1 on which the pixel circuits PX are formed in a matrix, and the base material resin layer B2 on which a color filter layer CF is formed, have a low rigidity, a step of forming a functional layer on the resin layers using, as bases, the support substrates SB1 and SB2 formed of a material such as glass is implemented.

In the embodiment as shown in FIG. 3A, a first sacrificial resin layer SC1, a first metal layer M1, a first transparent metal oxide layer TR1, and the first base material resin layer B1 are formed on the first support substrate SB1. A second sacrificial resin layer SC2, a second metal layer M2, a second transparent metal oxide layer TR2, and the second base material resin layer B2 are formed on the second support substrate SB2. A pixel circuit-constituting layer CL including the plurality of pixel circuits PX is disposed on the first base material resin layer B1. The color filter layer CF and a black matrix BM are disposed on the second base material resin layer B2. Moreover, a notch (groove) for providing the exposed area EX is formed in each of the layers formed on the second support substrate SB2 as shown in FIG. 3A.

As shown in FIG. 3A, a first protective layer PR1 and a second protective layer PR2 are formed on the first base material resin layer B1 and the second base material resin layer B2, respectively. A sealing material SL and a filling material FL are located between the first protective layer PR1 and the second protective layer PR2. The first base material resin layer B1 and the second base material resin layer B2 are bonded together through the sealing material SL and the filling material FL. At the stage of FIG. 3A, a terminal TE on the surface of which a transparent conductive film TR is formed is disposed in the exposed area EX, in the state of being covered by the first protective layer PR1.

Each of the first base material resin layer B1, the second base material resin layer B2, the first sacrificial resin layer SC1, and the second sacrificial resin layer SC2 is formed of, for example, a resin containing polyimide as a material. The first metal layer M1 and the second metal layer M2 are formed of, for example, Ti, Mo, or W (titanium, molybdenum, or tungsten) having a high melting point. The first base material resin layer B1 and the second base material resin layer B2 serving as base material layers of the flexible display are configured to have a thickness of approximately 10 μm (specifically, a thickness of 5 μm or more and 20 μm or less). The first and second metal layers M1 and M2 prevent a flash caused by a flash lamp described later from transmitting to the functional layer. Therefore, the first and second metal layers M1 and M2 are configured to have a thickness of at least approximately 100 nm (specifically, a thickness of 75 nm or more and 200 nm or less). The first transparent metal oxide layer TR1 and the second transparent metal oxide layer TR2 are layers for improving adhesion between the first metal layer M1 and the first base material resin layer B1 and adhesion between the second metal layer M2 and the second base material resin layer B2, and are formed of, for example, indium tin oxide (ITO) with a thickness of approximately 5 nm (specifically, a thickness of 3 nm or more and 20 nm or less). The first sacrificial resin layer SC1 and the second sacrificial resin layer SC2 are formed to a thickness of approximately 1 μm.

In the final state of the flexible display in the embodiment as shown in FIG. 3B, the support substrates SB1 and SB2 on both sides, the sacrificial resin layers SC1 and SC2 on both sides, and the second metal layer M2 on the side where the color filter layer CF is present are removed. Further, the protective films PT1 and PT2 are respectively attached to an outermost surface on the side of the first base material resin layer B1 and an outermost surface on the side of the second base material resin layer B2.

With reference to FIGS. 4A to 7D, a method of detaching the first base material resin layer B1 and the second base material resin layer B2 from the first support substrate SB1 and the second support substrate SB2 in the embodiment will be described in further detail below.

Figure 4A:
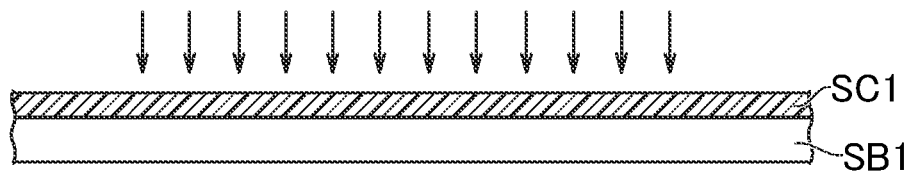
FIGS. 4A to 4C are diagrams for explaining a manufacturing step of the display device in the first embodiment.
Figure 4B:
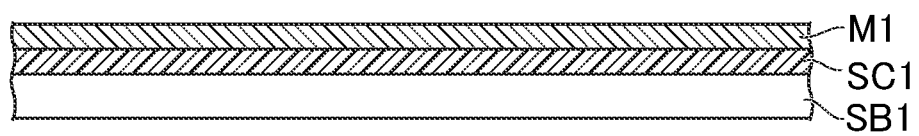
Figure 4C:
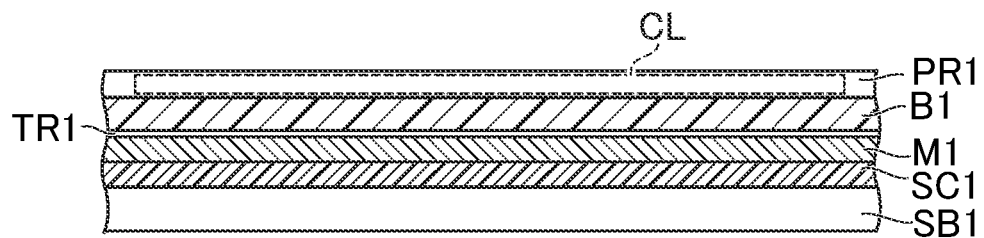

FIGS. 4A to 4C are diagrams for explaining a manufacturing step of the organic EL display device 1 in the embodiment, explaining a step of preparing a structure including the first and second support substrates SB1 and SB2, the first and second sacrificial resin layers SC1 and SC2, the first and second metal layers M1 and M2, the first and second transparent metal oxide layers TR1 and TR2, the first and second base material resin layers B1 and B2, and the functional layer (the color filter layer CF or the pixel circuit-constituting layer CL).

Specifically, as shown in FIG. 4A, the first sacrificial resin layer SC1 is first stacked on the first support substrate SB1, and then, the surface of the first sacrificial resin layer SC1 is subjected to a plasma treatment for modification. Thereafter, as shown in FIG. 4B, the first metal layer M1 is formed on the first sacrificial resin layer SC1 subjected to the plasma treatment. Further, as shown in FIG. 4C, the first transparent metal oxide layer TR1, the first base material resin layer B1, the pixel circuit-constituting layer CL, and the first protective layer PR1 are formed in this order to form a pixel circuit structure including the pixel circuit-constituting layer. As shown in FIG. 4C, the pixel circuit-constituting layer CL is covered by the first protective layer PR1.

Since the plasma treatment is performed in FIG. 4A, the adhesion between the first sacrificial resin layer SC1 containing polyimide as a material and the first metal layer M1 is improved, making it possible to advance subsequent manufacturing steps without problems. Similarly, also for a structure including the color filter layer CF as a functional layer, the surface of the second sacrificial resin layer SC2 is subjected to a plasma treatment to improve adhesion between the second sacrificial resin layer SC2 and the second metal layer M2.

Figure 5A:
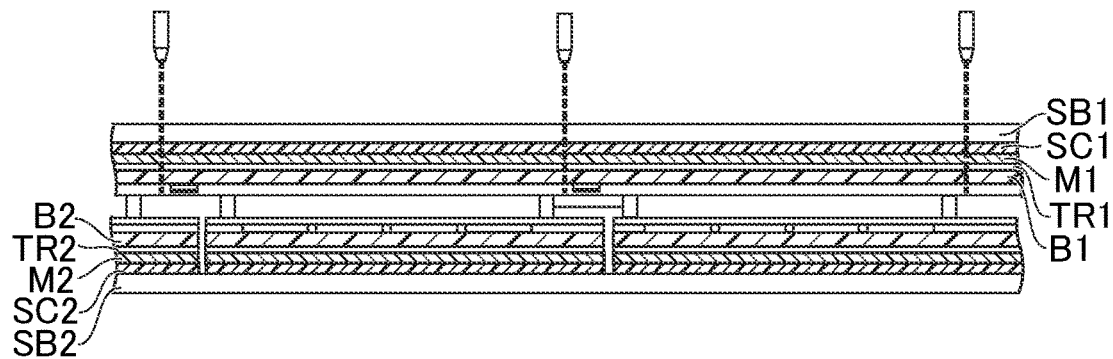
FIGS. 5A to 5C are diagrams for explaining a manufacturing step of the display device in the first embodiment.
Figure 5B:
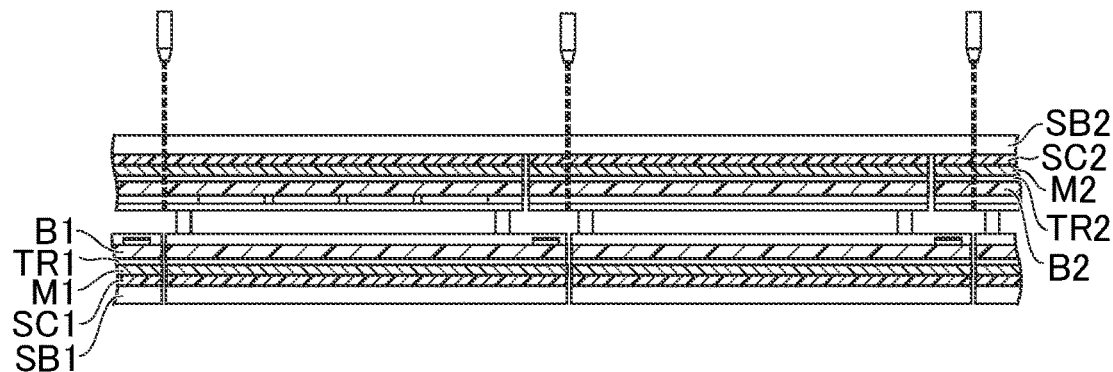
Figure 5C:
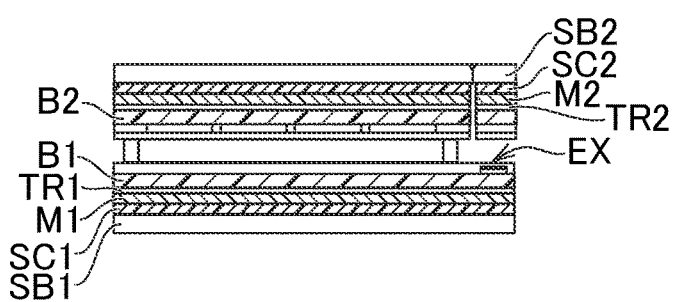

In a common manufacturing process, a plurality of organic EL display devices 1 or the layers included in the organic EL display device 1 are formed on a mother glass substrate, and then, the mother glass substrate is cut into individual organic EL display devices 1. FIGS. 5A to 5C are diagrams for explaining a manufacturing step of the organic EL display device 1 in the embodiment, explaining the state where a pair of mother glass substrates, on which the layers included in the organic EL display device 1 are formed and which are bonded together, are cut into individual organic EL display devices 1.

As shown in FIG. 5A, in the manufacturing step of the embodiment, the first support substrate SB1, in other words, the mother glass substrate on the side of the first support substrate SB1 is first cut by sandblasting. Then, as shown in FIG. 5B, the pair of mother glass substrates are inverted, and the second support substrate SB2, in other words, the mother glass substrate on the side of the second support substrate SB2 is cut. Thereafter, as shown in FIG. 5C, the mother glass substrate on the side of the second support substrate SB2 is scribed at the position overlapping the notch (groove) for providing the exposed area EX, and the second support substrate SB2 at the position facing the exposed area EX is cut off.

Here, especially FIGS. 6A to 6F are diagrams for explaining a step of detaching the second support substrate SB2 on the color filter layer CF side from the second base material resin layer B2.

Figure 6A:
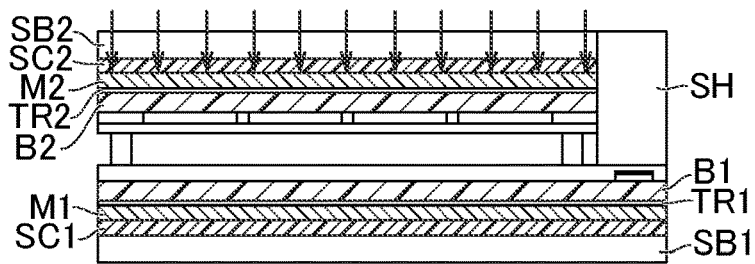
FIGS. 6A to 6F are diagrams for explaining a manufacturing step of the display device in the first embodiment.

As shown in FIG. 6A, in the step of detaching the second support substrate SB2 from the second base material resin layer B2 containing polyimide as a material, a pulsed light of a xenon flash lamp at a wavelength of from 200 to 1100 nm is first radiated from the second support substrate SB2 side. The radiation time of the xenon flash lamp is approximately from 1 µs to several ms, and the intensity of the xenon flash lamp is from several mJ/cm$^2$ to several tens mJ/cm$^2$. At this time, a light-shielding mask SH is disposed for the exposed area EX so that the light of the flash lamp is not radiated to the exposed area EX.

Figure 6B:
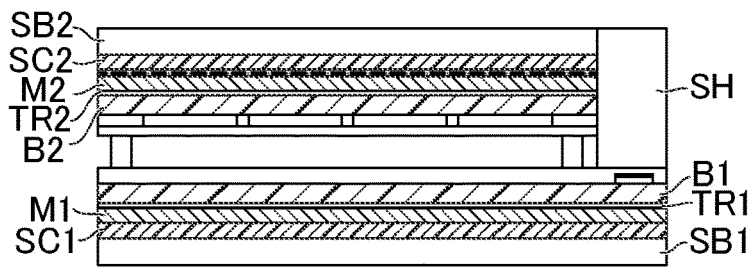
Figure 6C:
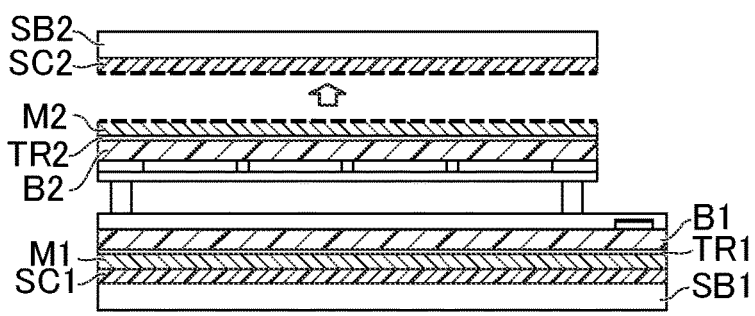

Thereafter, as shown in FIG. 6B, when the pulsed light caused by the xenon flash lamp is radiated so as to reach the second metal layer M2 through the second support substrate SB2 and the second sacrificial resin layer SC2, the pulsed light is absorbed by the second metal layer M2 and generates heat. The heat generated by the pulsed light is instantaneously conducted from the second metal layer M2 to the second sacrificial resin layer SC2, and as shown in FIG. 6C, the polyimide at the interface of the second sacrificial resin layer SC2 is thermally decomposed, resulting in detachment of the second support substrate SB2 and the second sacrificial resin layer SC2. The radiation time or intensity of the xenon flash lamp is adjusted such that the polyimide of the second sacrificial resin layer SC2 is heated to a temperature (approximately from 600 to 1200° C.) at which the polyimide is thermally decomposed.

Figure 6D:
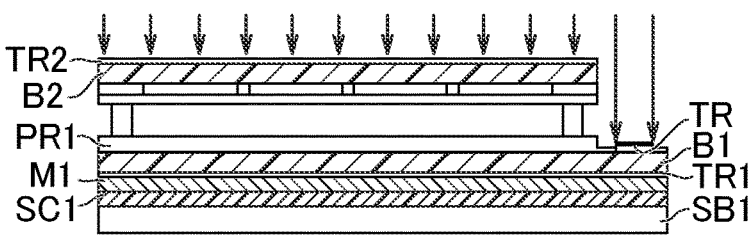

Next, as shown in FIG. 6D, the second metal layer M2 formed outside the color filter layer CF is removed by dry etching using fluorine radicals. The second metal layer M2 is removed in order to allow the light of the light-emitting element to exit from the second support substrate SB2 side. In this step of FIG. 6D, the first protective layer PR1 formed of, for example, a silicon nitride film or a silicon oxide film is simultaneously etched in the exposed area EX. Through the etching, the terminal TE located in the exposed area EX is exposed. The second transparent metal oxide layer TR2 and the transparent conductive film TR function as etching stopper films in this dry etching.

Figure 6E:
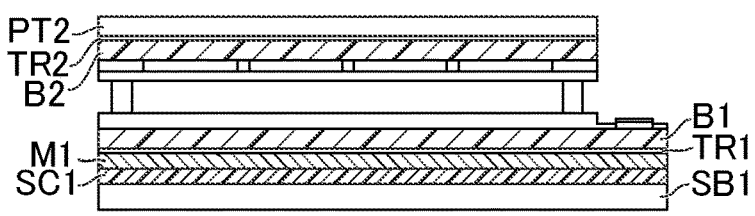
Figure 6F:
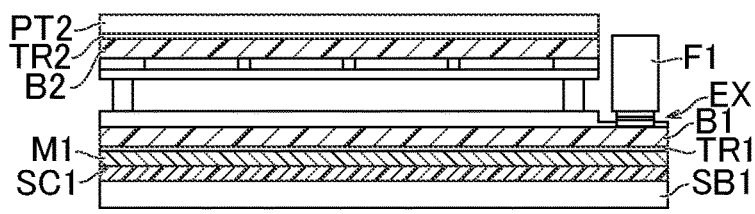

Thereafter, as shown in FIG. 6E, the protective film PT2 is disposed on the second transparent metal oxide layer TR2, and as shown in FIG. 6F, the flexible printed board F1 is connected at the terminal TE in the exposed area EX.

FIGS. 7A to 7D are diagrams for explaining a step of detaching the first support substrate SB1 from the first base material resin layer B1 on which the pixel circuits PX including thin film transistors made of low-temperature polysilicon (LTPS) are formed.

Figure 7A:
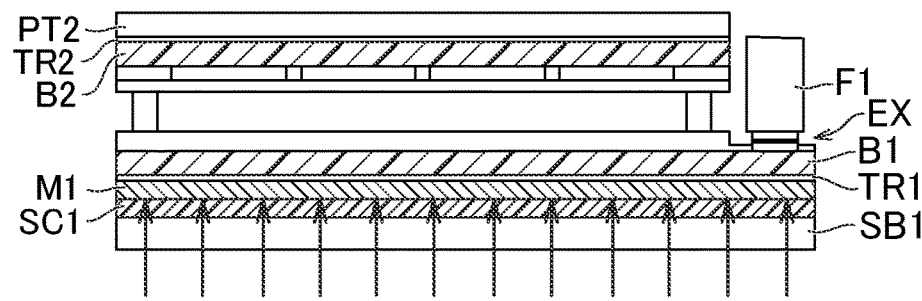
FIGS. 7A to 7D are diagrams for explaining a manufacturing step of the display device in the first embodiment.
Figure 7B:
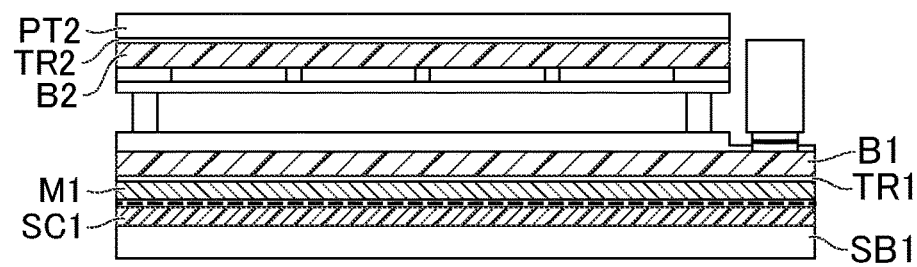

As shown in FIG. 7A, in the step of detaching the first support substrate SB1 from the first base material resin layer B1 containing polyimide as a material, the light of the xenon flash lamp is first radiated similarly to that in FIG. 6A. Thereafter, as shown in FIGS. 7B and 7C, heat is instantaneously conducted from the first metal layer M1 to the first sacrificial resin layer SC1, and the polyimide at the interface is thermally decomposed, resulting in detachment of the first support substrate SB1 and the first sacrificial resin layer SC1.

Figure 7C:
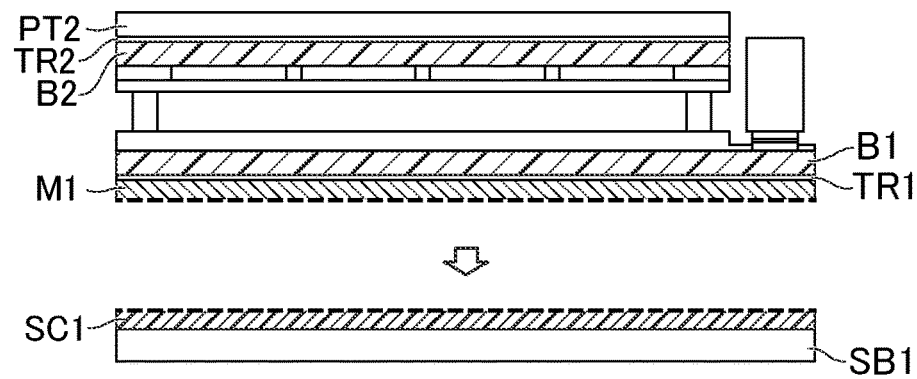
Figure 7D:
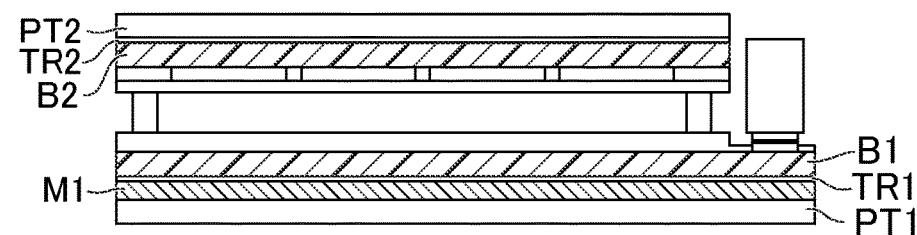

After the step of FIG. 7C, the protective film PT1 is attached to the rear surface of the first metal layer M1 as shown in FIG. 7D.

As shown in FIGS. 7D and 3B, the first metal layer M1 is left on the rear side of the first base material resin layer B1 including the pixel circuit-constituting layer, so that an electromagnetic wave, which may affect the functional layer including the pixel circuit PX, can be blocked. Moreover, the first transparent metal oxide layer TR1 is disposed between the first metal layer M1 and the first base material resin layer B1, improving the adhesion between the first base material resin layer B1 formed of polyimide and the first metal layer M1. The first transparent metal oxide layer TR1 is formed in this manner, so that also in the flexible display in which the functional layer is formed on the base material resin layer, a structure that blocks an electromagnetic wave can be stably formed on the base material resin layer.

In the embodiment, the organic EL display device 1 including an organic electroluminescence element has been described as an example of a display device. However, the display device may be a self-emitting display device including a light-emitting element such as a quantum-dot light-emitting element (quantum-dot light-emitting diode (QLED)) in each of pixels. Moreover, the invention is not limited to the self-emitting display device, and may also be applied to, for example, a flexible display such as a liquid crystal display device.

In the embodiment, the detaching method in which the metal layer and the sacrificial resin layer are disposed and which uses a flash lamp is used for both the base material resin layer including the color filter layer and the base material resin layer including the pixel circuit-constituting layer CL. However, the invention is not limited to such an aspect, and the detaching method may be used only for any one of the base material resin layers. Moreover, the base material resin layer on the counter substrate side where the pixel circuit-constituting layer is not provided may not necessarily include the color filter layer CF. For example, the pixels may only be partitioned by the black matrix BM, or a circular polarizer or a touch panel may be provided instead of the color filter layer CF. Especially in an organic EL display device including an organic electroluminescence element, the color filter layer is unnecessary when an organic light-emitting layer is colored in separate three colors of red, yellow, and blue. Therefore, it is preferred to use a circular polarizer or a touch panel as a counter substrate.

[Second Embodiment]

Figure 8A:
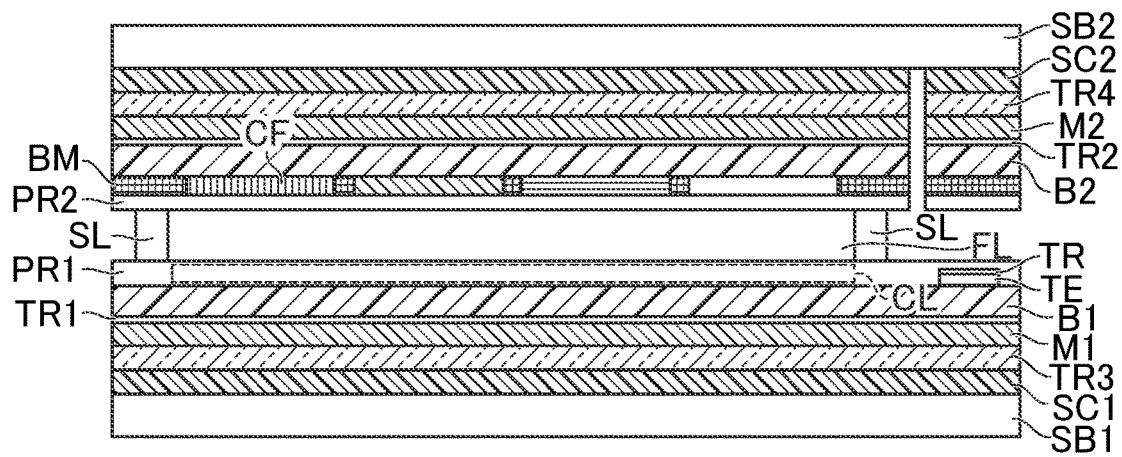
FIG. 8A is a diagram showing a cross-section of a display device in a second embodiment, in a state before detaching resin layers from support substrates.
Figure 8B:
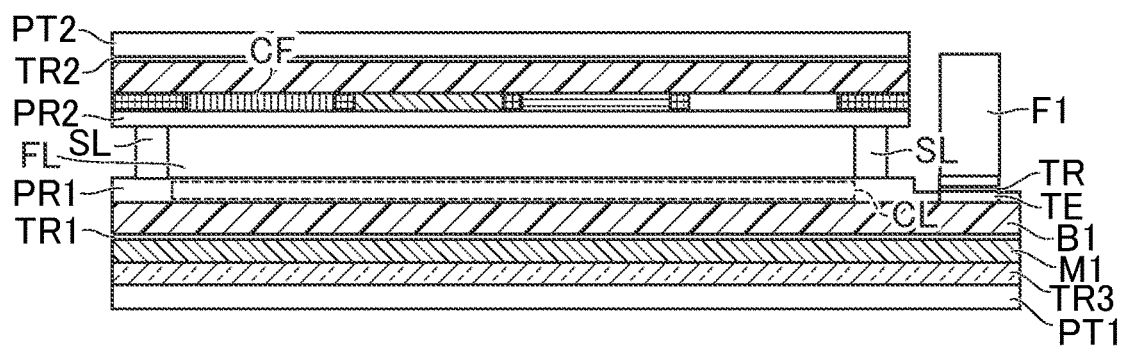
FIG. 8B is a diagram showing a cross-section of the display device in the second embodiment, in a state after detaching the resin layers from the support substrates.

FIGS. 8A and 8B are diagrams for explaining a second embodiment. In the embodiment, differences from the first embodiment will be described. Portions corresponding to those of the first embodiment are given the same reference numerals and signs. An organic EL display device shown in FIG. 8B further includes a third transparent metal oxide layer TR3 disposed between the first metal layer M1 and the first protective film PT1, compared with the first embodiment.

As shown in FIG. 8A, which shows the organic EL display device during its manufacture, the third transparent metal oxide layer TR3 is formed after forming the first sacrificial resin layer SC1 and before forming the first metal layer M1. The third transparent metal oxide layer TR3 enhances the adhesion between the first sacrificial resin layer SC1 and the first metal layer M1. This makes it possible to prevent the detachment of the first metal layer M1 from the first sacrificial resin layer SC1 during the manufacturing step. Further, a fourth transparent metal oxide layer TR4 is formed after forming the second sacrificial resin layer SC2 and before forming the second metal layer M2. Thereafter, the fourth transparent metal oxide layer TR4 is removed after detaching the second sacrificial resin layer SC2 and before removing the second metal layer M2. Specifically, the process shown in FIGS. 6C and 6D is applied. The fourth transparent metal oxide layer TR4 enhances the adhesion between the second sacrificial resin layer SC2 and the second metal layer M2. This makes it possible to prevent the detachment of the second metal layer M2 from the second sacrificial resin layer SC2 during the manufacturing step.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a first protective film;
   a metal layer stacked on the first protective film;
   a first transparent metal oxide layer stacked on the metal layer;
   a first base material resin layer stacked on the first transparent metal oxide layer; and
   pixels with pixel circuits stacked above the first base material resin layer.

2. The display device according to claim 1, further comprising:
   a functional layer located above the pixels;
   a second transparent metal oxide layer located on the functional layer;
   a second base material resin layer located on the second transparent metal oxide layer; and
   a second protective film located on the second base material resin layer.

3. The display device according to claim 1, further comprising a third transparent metal oxide layer between the first protective film and the metal layer.

4. The display device according to claim 1, wherein the metal layer includes one of titanium, molybdenum, and tungsten.

5. The display device according to claim 1, wherein a thickness of the metal layer is 75 nm or more and 200 nm or less.

6. The display device according to claim 1, wherein a second protective film is located above an opposite side of the pixels from the first base material resin layer.

7. The display device according to claim 1, wherein a circular polarizer is located above an opposite side of the pixels from the first base material resin layer.

8. The display device according to claim 1, wherein a touch panel is located above an opposite side of the pixels from the first base material resin layer.

9. A display device comprising:
   a protective film;
   a metal layer on the protective film;
   a transparent metal oxide layer on the metal layer;
   a resin layer on the transparent metal oxide layer; and
   thin film transistors above the resin layer.

10. The display device according to claim 9, wherein pixels including the thin film transistors are located above the resin layer.

11. The display device according to claim 10, wherein each of the pixels has a light-emitting element.

12. The display device according to claim 10, wherein a circular polarizer is located above an opposite side of the pixels from the resin layer.

13. The display device according to claim 10, wherein a touch panel is located above an opposite side of the pixels from the resin layer.

14. The display device according to claim 9, further comprising a third transparent metal oxide layer between the protective film and the metal layer.

15. The display device according to claim 9, wherein the metal layer includes one of titanium, molybdenum, and tungsten.

16. The display device according to claim 9, wherein a thickness of the metal layer is 75 nm or more and 200 nm or less.

17. The display device according to claim 9, wherein a second protective film is located above an opposite side of the resin layer from the protective film.

* * * * *